United States Patent
Miller et al.

(10) Patent No.: US 10,105,811 B2
(45) Date of Patent: *Oct. 23, 2018

(54) EDDY CURRENT SYSTEM HAVING AN ELONGATED CORE FOR IN-SITU PROFILE MEASUREMENT

(75) Inventors: G. Laurie Miller, Eastham, MA (US); Boguslaw A. Swedek, Cupertino, CA (US); Manoocher Birang, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 290 days.

This patent is subject to a terminal disclaimer.

(21) Appl. No.: 13/207,213

(22) Filed: Aug. 10, 2011

(65) Prior Publication Data

US 2011/0294402 A1    Dec. 1, 2011

Related U.S. Application Data

(62) Division of application No. 11/505,659, filed on Aug. 16, 2006, now Pat. No. 7,999,540, which is a division
(Continued)

(51) Int. Cl.
*G01B 7/06* (2006.01)
*B24B 37/013* (2012.01)
(Continued)

(52) U.S. Cl.
CPC .......... *B24B 37/013* (2013.01); *B24B 49/105* (2013.01); *G01B 7/10* (2013.01); *H01L 21/67253* (2013.01)

(58) Field of Classification Search
CPC ........... H01L 21/67253; H01L 21/3212; H01L 21/3213; H01L 22/14; H01L 22/26;
(Continued)

(56) References Cited

U.S. PATENT DOCUMENTS

| 2,608,860 A | 9/1952 | Ramey et al. |
| 4,000,458 A | 12/1976 | Miller et al. |

(Continued)

FOREIGN PATENT DOCUMENTS

| EP | 0 460 348 A2 | 12/1991 |
| EP | 1 116 552 A2 | 7/2001 |

(Continued)

OTHER PUBLICATIONS

Definition of the term "edge", obtained from Merriam-Webster (http://www.merriam-webster.com/dictionary/edge), obtained on Feb. 4, 2016.*

(Continued)

*Primary Examiner* — David M. Schindler
(74) *Attorney, Agent, or Firm* — Fish & Richardson P.C.

(57) ABSTRACT

An eddy current monitoring system may include an elongated core. One or more coils may be coupled with the elongated core for producing an oscillating magnetic field that may couple with one or more conductive regions on a wafer. The core may be translated relative to the wafer to provide improved resolution while maintaining sufficient signal strength. An eddy current monitoring system may include a DC-coupled marginal oscillator for producing an oscillating magnetic field at a resonant frequency, where the resonant frequency may change as a result of changes to one or more conductive regions. Eddy current monitoring systems may be used to enable real-time profile control.

17 Claims, 11 Drawing Sheets

Related U.S. Application Data of application No. 10/633,276, filed on Jul. 31, 2003, now Pat. No. 7,112,960.

(51) Int. Cl.
*B24B 49/10* (2006.01)
*H01L 21/67* (2006.01)

(58) Field of Classification Search
CPC ... B24B 37/013; B24B 49/105; B24B 37/205; G01B 7/02; G01B 7/06; G01B 7/10; G01B 7/105; G01B 7/107; G01B 7/14; G01B 5/06; G01B 5/068
USPC ......................................................... 324/229
See application file for complete search history.

(56) References Cited

U.S. PATENT DOCUMENTS

| | | |
|---|---|---|
| 4,005,359 A | 1/1977 | Smoot |
| 4,303,885 A | 12/1981 | Davis et al. |
| 4,467,281 A | 8/1984 | Davis et al. |
| 4,547,962 A * | 10/1985 | deWalle et al. ............... 29/606 |
| 4,556,845 A | 12/1985 | Strobe et al. |
| 4,715,007 A | 12/1987 | Fujita et al. |
| 4,716,366 A | 12/1987 | Hosoe et al. |
| 4,771,238 A | 9/1988 | Caruso et al. |
| 4,803,444 A | 2/1989 | Takahashi |
| 4,810,965 A * | 3/1989 | Fujiwara ............... G01D 5/20 324/207.21 |
| 4,829,251 A | 5/1989 | Fischer |
| H0000879 H * | 1/1991 | Vernon et al. ............... 324/240 |
| 5,003,262 A | 3/1991 | Egner et al. |
| 5,142,228 A | 8/1992 | Kingsburg |
| 5,213,655 A | 5/1993 | Leach et al. |
| 5,237,271 A | 8/1993 | Hedengren |
| 5,343,146 A | 8/1994 | Koch et al. |
| 5,355,083 A | 10/1994 | George et al. |
| 5,541,510 A | 7/1996 | Danielson |
| 5,559,428 A | 9/1996 | Li et al. |
| 5,570,017 A | 10/1996 | Blum |
| 5,644,221 A | 7/1997 | Li et al. |
| 5,660,672 A | 8/1997 | Li et al. |
| RE35,703 E | 12/1997 | Koch et al. |
| 5,731,697 A | 3/1998 | Li et al. |
| 6,057,684 A | 5/2000 | Murakami et al. |
| 6,072,320 A | 6/2000 | Verkuil |
| 6,232,775 B1 | 5/2001 | Naitoh et al. |
| 6,707,540 B1 | 3/2004 | Lehman et al. |
| 7,024,268 B1 | 4/2006 | Bennett et al. |
| 7,074,109 B1 | 7/2006 | Bennett et al. |
| 7,112,960 B2 * | 9/2006 | Miller et al. ............... 324/230 |
| 7,999,540 B2 | 8/2011 | Miller et al. |
| 2002/0047705 A1 | 4/2002 | Tada et al. |
| 2002/0055192 A1 | 5/2002 | Redeker et al. |
| 2002/0077031 A1 | 6/2002 | Johansson et al. |
| 2002/0164925 A1 * | 11/2002 | Swedek et al. ............... 451/5 |
| 2003/0148706 A1 | 8/2003 | Birang et al. |
| 2003/0201769 A1 * | 10/2003 | Hanawa et al. ............... 324/230 |
| 2004/0150500 A1 | 8/2004 | Kiko |
| 2004/0176014 A1 * | 9/2004 | Bennett et al. ............... 451/5 |
| 2004/0242121 A1 | 12/2004 | Hirokawa et al. |

FOREIGN PATENT DOCUMENTS

| | | |
|---|---|---|
| FR | 2 473 168 | 3/1979 |
| JP | 60-13203 | 1/1985 |
| JP | 05-319874 | 3/1993 |
| JP | 08-285514 | 1/1996 |
| JP | 11-337304 | 12/1999 |
| JP | 2001-060572 | 3/2001 |
| JP | 2003-106333 | 4/2003 |
| WO | 2001/46684 | 6/2001 |
| WO | 2001/89765 | 11/2001 |

OTHER PUBLICATIONS

G.L. Miller et al.; "Contactless Measurement of Semiconductor Conductivity by Radio Frequency-Free-Carrier Power Absorption;" Rcvd. Oct. 24, 1975; in final form, Mar. 24, 1976; Review of Scientific Instruments, vol. 47, No. 7, Jul. 1976; Copyright (c) 1976 American Institute of Physics, pp. 799-805.

Applied Materials, Inc., Search Report for Corresponding Taiwan Invention Patent Application No. 093122765 dated Jul. 22, 2008, 1page, Has Jun. 19, 2008 at bottom.

Notice to file a response in the Korean Application No. 10-2006-7002131 dated Mar. 10, 2011 together with English translation, 14 pages.

Japanese Office Action in Japanese Application No. 2011-145683, dated Apr. 16, 2013, 3 pages.

\* cited by examiner

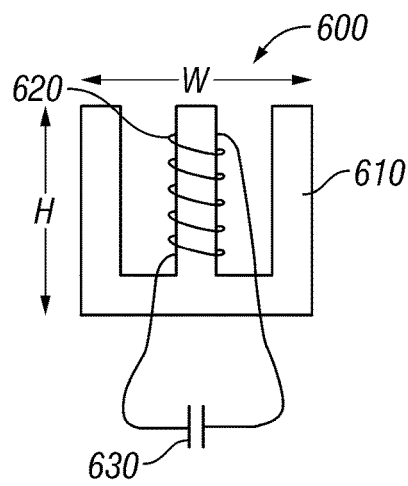
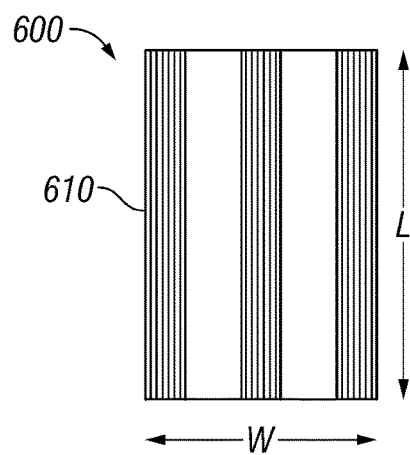
*FIG. 6A*  *FIG. 6B*
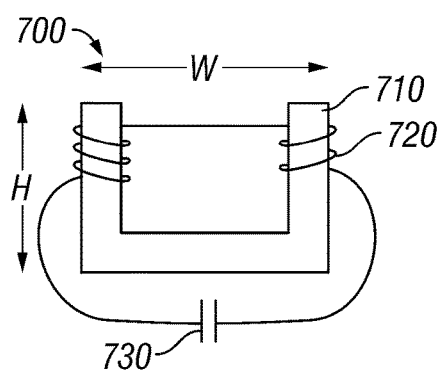
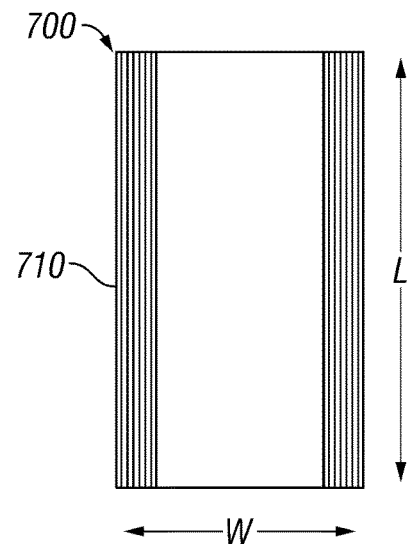
*FIG. 7A*  *FIG. 7B*
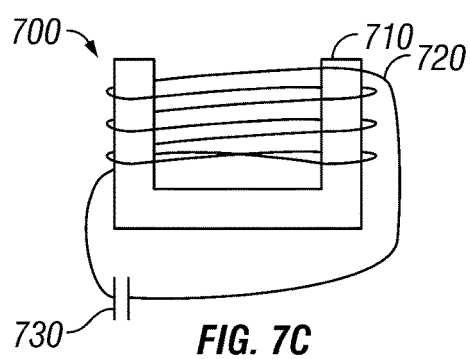
*FIG. 7C*

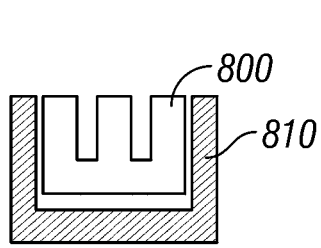
FIG. 8A
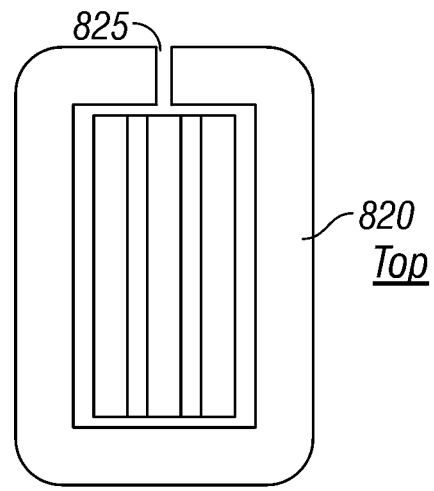
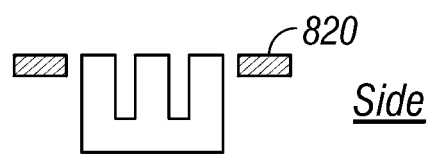
FIG. 8B
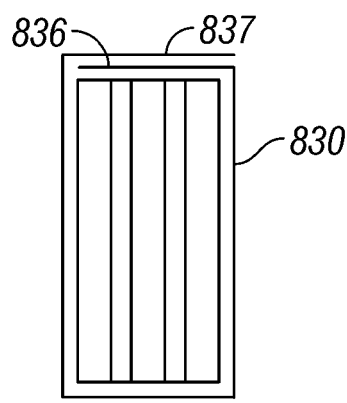
FIG. 8C

EDDY CURRENT SYSTEM HAVING AN ELONGATED CORE FOR IN-SITU PROFILE MEASUREMENT

CROSS-REFERENCE TO RELATED APPLICATIONS

This application is a divisional of U.S. application Ser. No. 11/505,659, filed Aug. 16, 2006, which is a divisional of U.S. application Ser. No. 10/633,276, filed Jul. 31, 2003, the disclosures of which are incorporated herein by reference in their entirety.

TECHNICAL FIELD

This disclosure relates to semiconductor processing, and more particularly to systems and techniques for monitoring one or more conductive regions during semiconductor processing.

BACKGROUND

An integrated circuit is typically formed on a substrate (e.g. a semiconductor wafer) by the sequential deposition of conductive, semiconductive or insulative layers on a silicon wafer, and by the subsequent processing of the layers.

One fabrication step involves depositing a filler layer over a non-planar surface, and planarizing the filler layer until the non-planar surface is exposed. For example, a conductive filler layer can be deposited on a patterned insulative layer to fill the trenches or holes in the insulative layer. The filler layer is then polished until the raised pattern of the insulative layer is exposed. After planarization, the portions of the conductive layer remaining between the raised pattern of the insulative layer form vias, plugs and lines that provide conductive paths between thin film circuits on the substrate. In addition, planarization may be used to planarize the substrate surface for lithography.

Chemical mechanical polishing (CMP) is one accepted method of planarization. This planarization method typically requires that the substrate be mounted on a carrier or polishing head. The exposed surface of the substrate is placed against a rotating polishing disk pad or belt pad. The polishing pad can be either a "standard" pad or a fixed-abrasive pad. A standard pad has a durable roughened surface, whereas a fixed-abrasive pad has abrasive particles held in a containment media. The carrier head provides a controllable load on the substrate to push it against the polishing pad. A polishing slurry, including at least one chemically-reactive agent, and abrasive particles if a standard pad is used, is supplied to the surface of the polishing pad.

During semiconductor processing, it may be important to determine one or more characteristics of the substrate or layers on the substrate. For example, it may be important to know the thickness of a conductive layer during a CMP process, so that the process may be terminated at the correct time. A number of methods may be used to determine substrate characteristics. For example, optical or capacitance sensors may be used for in-situ monitoring of a substrate during chemical mechanical polishing. Alternately (or in addition), an eddy current sensing system may be used to induce eddy currents in a conductive region on the substrate to determine parameters such as the local thickness of the conductive region.

SUMMARY

The current disclosure provides systems and techniques for obtaining high spatial resolution eddy current measurements, and for obtaining eddy current measurements with a high signal to noise ratio. In general, in one aspect an eddy current sensing system includes an elongated core. The elongated core has a length greater than a width. A coil wound around a protrusion of the elongated core produces a time-dependent magnetic field to induce eddy currents in a conductive region such as a first region of a conductive layer on a wafer. The first region in which the eddy currents are induced is elongated as well, having a length greater than a width.

The elongated core may be positioned proximate to a wafer carrier of a semiconductor processing apparatus. For example, the core may be positioned at least partially in a platen of a chemical mechanical polishing apparatus, so that a top surface of the protrusion is to be positioned proximate to a top surface of a polishing pad coupled with the platen. The elongated core may comprise a ferrite material such as a MnZn ferrite, NiZn ferrite, or other ferrite. The elongated core may be coated with a material such as parylene.

In general, in one aspect, a method comprises processing a conductive layer on a wafer using a plurality of processing parameters. For example, a metal layer may be polished using a CMP apparatus, and the processing parameters may include a slurry composition, as well as a pressure profile applied by a polishing head.

Eddy currents may be induced in a first region of a conductive layer on a wafer, where the first region has a length greater than a width. The eddy currents may be induced using a time-dependent magnetic field generated by a current in a coil wound around an elongate core.

Thickness data may be acquired for the conductive layer in the first region based on the eddy currents induced in the first region. Eddy currents may be induced in a second region of the conductive layer, and measured thickness data for the second region may be acquired. The measured thickness data for the first and second regions can be compared to a desired thickness profile to determine a profile error. If the profile error exceeds a minimum desired error, one or more processing parameters may be changed.

The width of the first region may be about a millimeter or less, so that the spatial resolution of the system at the first region is on the order of about a millimeter. The width may be between about one millimeters and about three millimeters.

In general, in one aspect, a chemical mechanical polishing apparatus comprises a direct current (DC) coupled marginal oscillator to generate a time-dependent current in a coil, the coil to generate a time-dependent magnetic field to couple with a portion of a conductive region on a wafer. The marginal oscillator may comprise a first transistor and a second transistor forming a long-tailed pair. The marginal oscillator may comprise a third transistor coupled with the first transistor to provide DC feedback through a base of the first transistor.

The marginal oscillator may generate a time-dependent drive current at the resonant frequency of a circuit comprising the coil coupled with a core and a capacitor. The third transistor may provide the direct current feedback to the base of the first transistor to cause the marginal oscillator to generate the time-dependent drive current such that a potential difference across the coil and the capacitor is maintained at a generally constant amplitude.

In general, in one aspect, a method may include generating a time-dependent drive current at a resonant frequency of a circuit comprising a coil coupled with a core and a capacitor, the time-dependent current generated by a marginal oscillator having a first transistor and a second transistor comprising a long-tailed pair. The method may include inducing eddy currents in a first region of a conductive layer on a wafer, wherein the eddy currents are induced by a time-dependent magnetic field produced by the coil. The method may include determining an amplitude of a potential difference across the coil and the capacitor and adjusting the time dependent drive current based on direct current feedback from a third transistor coupled to the base of the first transistor to maintain a desired amplitude of the potential difference. The method may include determining one or more parameters of the first region based on the time-dependent drive current.

The details of one or more implementations are set forth in the accompanying drawings and the description below. Other features and advantages of the invention will be apparent from the description and drawings, and from the claims.

DESCRIPTION OF DRAWINGS

FIGS. 6A and 6B show side and top views of an embodiment of an elongated core for use in an eddy current monitoring system.

FIGS. 7A to 7C show side and top views of another embodiment of an elongated core for use in an eddy current monitoring system.

FIGS. 8A through 8C show embodiments of core shielding that may be used.

Like reference symbols in the various drawings indicate like elements.

DETAILED DESCRIPTION

In some semiconductor processes, it may be important to know the thickness of a conductive region on the substrate. For example, in order to determine an endpoint of a metal chemical mechanical polishing process, the thickness of the metal layer may need to be monitored. The polishing process may be terminated based on measurements related to the thickness of the metal layer.

The thickness of a conductive material may be measured at different regions on the substrate such as a wafer. For example, the thickness of a metal layer at different regions on a wafer may be monitored to ensure that processing is proceeding uniformly across the wafer. Thickness information for regions of the wafer (which collectively may be referred to as a "profile" of the wafer) may then be used to adjust processing parameters in real time to obtain desired cross-wafer uniformity. For example, in a chemical mechanical polishing process, the thickness of a metal layer at different regions on the wafer may be monitored, and detected non-uniformities may cause the CMP system to adjust polishing parameters in real time. Such profile control may be referred to as real time profile control (RTPC).

Figure 1:
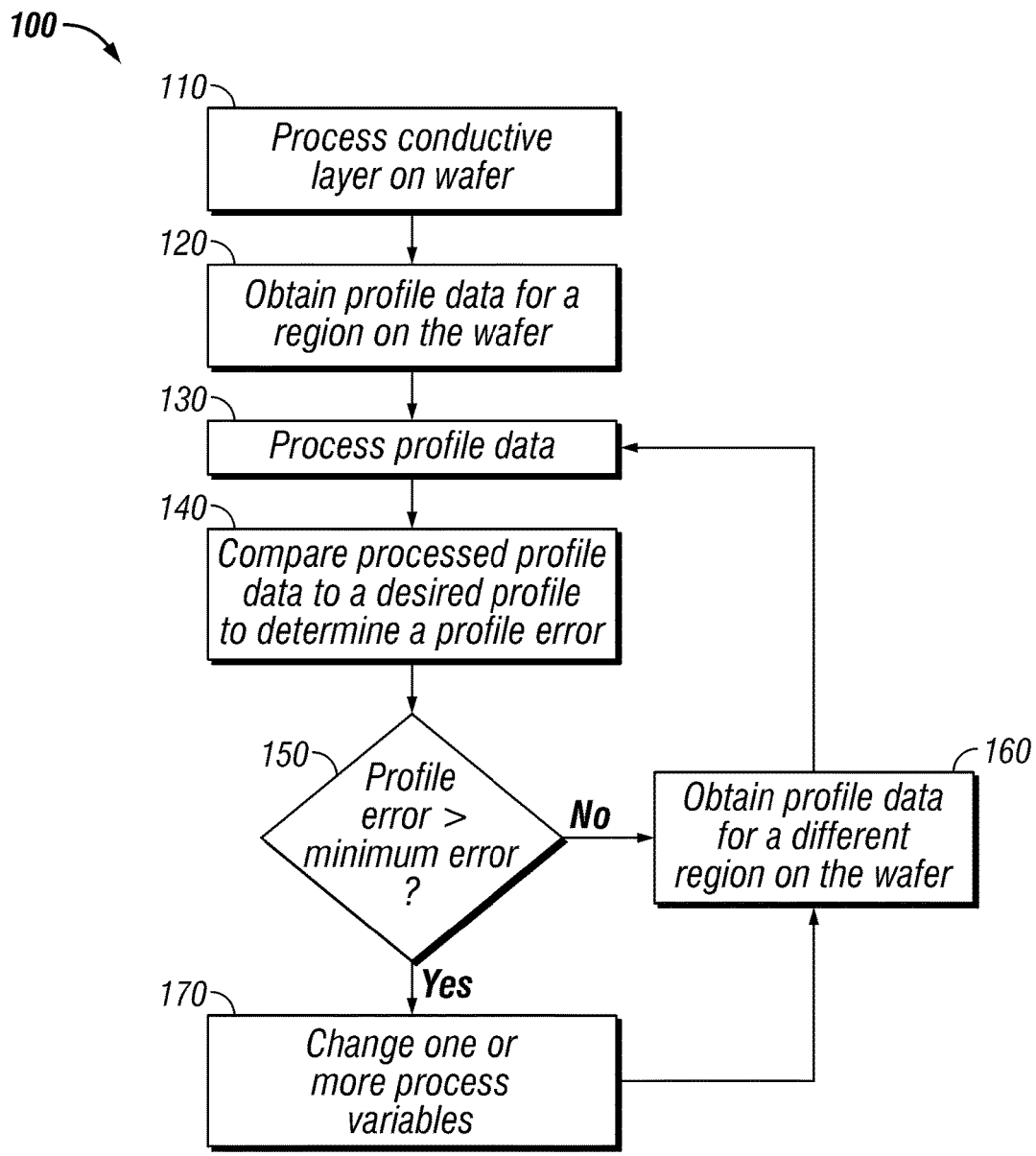
FIG. 1 shows a method to implement real-time profile control.

FIG. 1 shows a method 100 that may be used to implement RTPC during semiconductor processing. A conductive layer on the wafer may be processed (110). For example, a copper layer on a wafer may be polished with a CMP apparatus including a multi-zone head. While the wafer is being polished, profile data may be obtained for a region on the wafer (120). For example, eddy current data related to the thickness of a portion of the copper layer coupled with a magnetic field produced by an eddy current sensing system may be obtained during polishing.

The profile data may be processed (130). For example, signal processing algorithms may be used to equate eddy current measurements with particular regions of the wafer. The processed profile data may then be compared to desired profile data to determine if a profile error is greater than a minimum acceptable error (150). If it is not, the processing parameters may be unchanged, and further profile data may be obtained for a different region on the wafer (160). For example, an eddy current sensor may be translated with respect to the wafer, so that profile information is obtained for regions at different radial distances from the center of the wafer. Note that the process of obtaining and processing data, shown as separate discrete steps for different regions of the wafer in FIG. 1, may occur generally continuously and concurrently, with data acquisition occurring on timescales that are short compared to relative translation of an eddy current sensor with respect to a wafer.

If the error is greater than a minimum acceptable error, one or more process variables may be changed (170). For example, the CMP system may make an incremental change to a variable such as the pressure of one or more of the zones in the multi-zone head, in order to improve polishing uniformity (thus subsequently reducing the measured profile error).

Figure 2A:
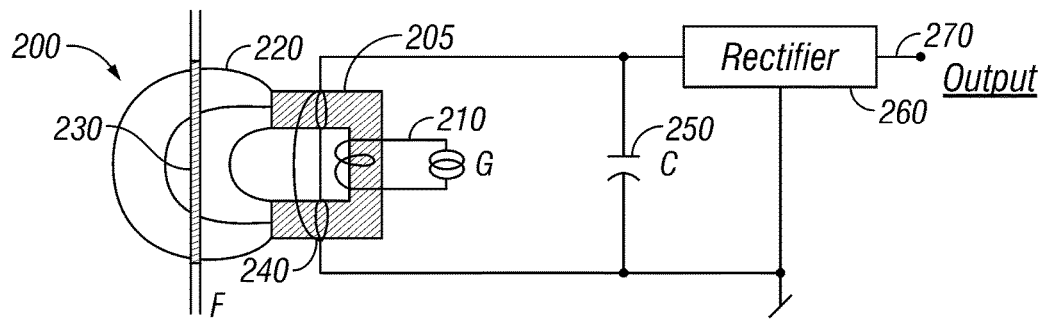
FIGS. 2A and 2B show schematic diagrams of embodiments of an eddy current monitoring system.

As noted above, profile information may be obtained using eddy current sensing. With eddy current sensing, an oscillating magnetic field induces eddy currents in a conductive region on the wafer. The eddy currents are induced in a region that is coupled with magnetic flux lines generated by the eddy current sensing system. FIG. 2A shows a schematic of a portion of an eddy current sensing system 200. System 200 includes a drive coil 210 for generating an oscillating magnetic field 220, which may couple with a conductive region 230 of interest (e.g., a portion of a metal layer on a semiconductor wafer). Drive coil 210 is wound around a core 205, which may be formed of a ferrite material such as a MnZn or NiZn ferrite. Core 205 may be a generally cylindrically symmetric core, or may be an elongated core such as that shown in FIGS. 6A and 6B or FIGS. 7A and 7B, and as described below. The oscillating magnetic field extends through the body of core and into the gap between the two poles of the core.

Oscillating magnetic field 220 generates eddy currents locally in conductive region 230. The eddy currents cause conductive region 230 to act as an impedance source in parallel with a sense coil 240 and a capacitor 250. As the thickness of conductive region 230 changes, the impedance changes, resulting in a change in the Q-factor of the system. By detecting the change in the Q-factor, the eddy current sensing mechanism can sense the change in the strength of the eddy currents, and thus the change in thickness of the conductive region. Therefore, eddy current sensing systems may be used to determine parameters of the conductive region, such as a thickness of the conductive region, or may be used to determine related parameters, such as a polishing endpoint. Note that although the thickness of a particular conductive region is discussed above, the relative position of core 205 and the conductive layer may change, so that thickness information for a number of different conductive regions is obtained.

Figure 2B:
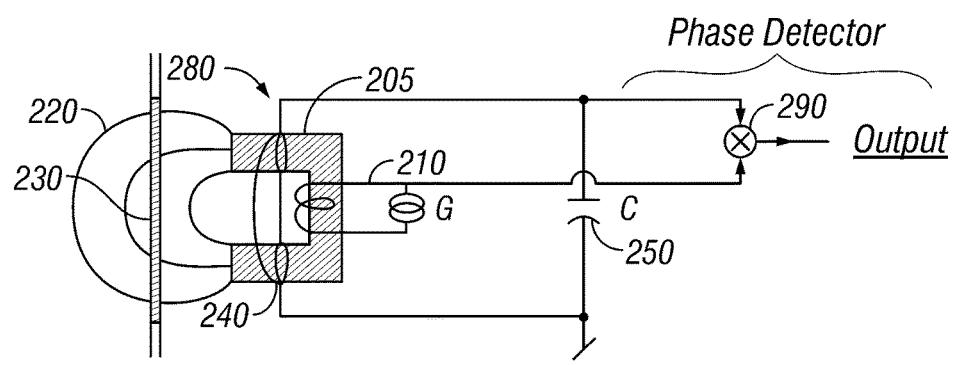

In some implementations, a change in Q-factor may be determined by measuring an eddy current amplitude as a function of time, for a fixed drive frequency and amplitude. An eddy current signal may be rectified using a rectifier 260, and the amplitude monitored via an output 270. Alternately, a change in Q-factor may be determined by measuring an eddy current phase as a function of time. FIG. 2B shows a system 280 for monitoring the phase as a function of time using a phase detector 290.

Figure 3A:
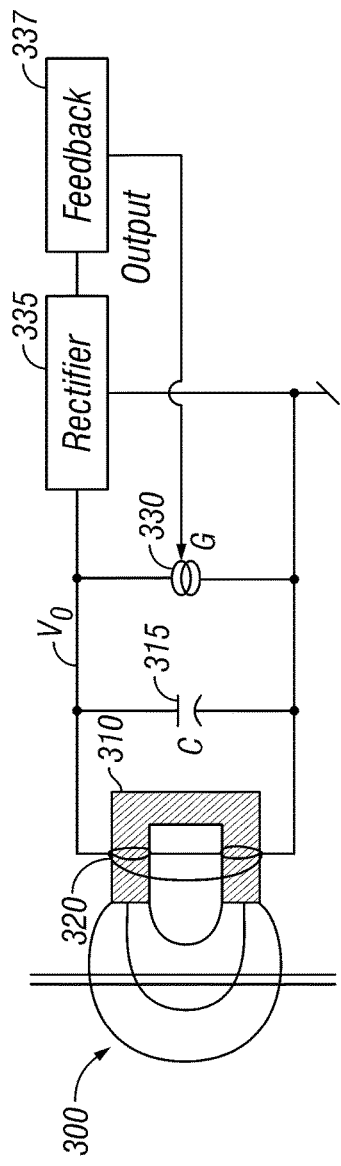
FIGS. 3A and 3B show an embodiment of an eddy current monitoring system for improved linearity and signal to noise ratio.
Figure 3B:
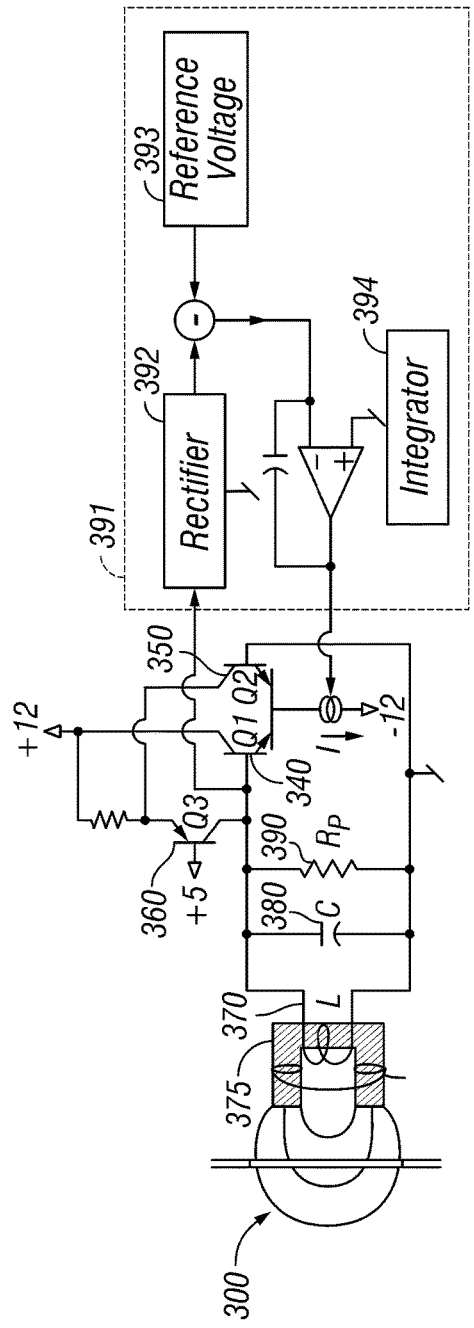

System 200 of FIGS. 2A and 2B may be used to measure the thickness of a conductive layer on a substrate. However, in some implementations, an eddy current sensing system with a higher signal to noise ratio and/or improved spatial resolution and linearity may be desired. For example, in RTPC applications, obtaining desired cross-wafer uniformity may require an improved eddy current sensing system. FIGS. 3A and 3B show an eddy current sensing system for improved signal to noise ratio and linearity, while FIGS. 6A, 6B, 7A, and 7B show a core design that may be used for improved spatial resolution. Either or both of these techniques may be used to improve eddy current sensing.

FIG. 3A shows an eddy current sensing system 300 that may be more linear, more stable, and provide a higher signal to noise ratio than the systems shown in FIGS. 2A and 2B. System 300 includes a coil 320 coupled with a core 310 (e.g., a generally cylindrically symmetric core, an elongated core such as that shown in FIGS. 5A and 5B or FIGS. 6A and 6B, or other core). In operation, a current generator 330 (e.g., a current generator based on a marginal oscillator circuit) drives the system at the resonant frequency of an LC tank circuit formed by coil 320 (with inductance L) and a capacitor 315 (with capacitance C). A time-dependent voltage with amplitude $V_0$ is rectified using a rectifier 335 and provided to a feedback circuit 337. Feedback circuit 337 determines a drive current for current generator 330 to keep the amplitude of the voltage $V_0$ constant. For such a system, the magnitude of the drive current can be shown to be proportional to the conducting film thickness. Marginal oscillator circuits and feedback circuits are further described in U.S. Pat. No. 4,000,458, which is incorporated by reference, as well as in "Contactless Measurement of Semiconductor Conductivity by Radio Frequency-Free-Carrier Power Absorption," G. L. Miller, D. A. H. Robinson and J. D. Wiley, *Review of Scientific Instruments*, vol. 47, No. 7, July, 1976, which is incorporated by reference.

A number of benefits may be obtained using a system such as system 300. As long as the operating frequency is low enough that the magnetic field is not overly attenuated in the conductive region, the drive current is linear with conductive region thickness. Additionally, since the oscillation amplitude is fixed, a highly linear RF rectifier is not necessary. The signal to noise ratio is improved over other measurement methods, since the system is operated at the peak of the LC tank resonance curve.

System 300 may also provide fast response (e.g., response times on the order of about 50 microseconds may be obtained), and may be more simple to operate and analyze than the implementations of FIGS. 2A and 2B. Finally, system 300 requires a single coil rather than separate drive and sense coils, which reduces complexity and saves winding space.

FIG. 3B shows an implementation of system 300 where current generator 330 includes an improved direct current (DC) coupled marginal oscillator circuit including a first transistor 340, a second transistor 350, and a third transistor 360. First transistor 340 and second transistor 350 form a long-tailed pair: that is, they are substantially identical transistors, and a drive current I is alternately switched through first transistor 340 and second transistor 350. Third transistor 360 provides DC feedback to the long-tailed pair through a coupling with the base of first transistor 340. Generally, a large amplitude of oscillation $V_0$ (for example, four volts peak-to-peak) is used. The drive current I is determined by measuring the average value of the collector current for transistor 340.

The marginal oscillator formed using first transistor 340, second transistor 350, and third transistor 360 generates a time-dependent current in a coil 370 wound around a core 375. The time-dependent current generates the time-dependent magnetic field that couples with a portion of a conductive layer to provide local thickness information. Feedback is provided using an amplitude stabilization loop 391 including a rectifier 392, a reference voltage 393, and an integrator 394. Rectifier 392 may be a peak stretcher, and reference voltage 393 may be +2 volts, leading to an RF amplitude of 4 volts peak to peak across the LC tank circuit.

As noted above, when the marginal oscillator operates at the resonant frequency of the LC tank circuit, the magnitude of the drive current required to maintain a constant $V_0$ is linearly related to the thickness of the conductive layer. At resonance, the loss is resistive and can be modeled as a parallel loss resistance $R_P$ 390. $R_P$ includes a tank circuit resistance $R_T$ (including, e.g., the resistance of the coil wire), and a sample loading resistance $R_S$. The resistances are related as shown in Equation (1) below:

$$\frac{1}{R_P} = \frac{1}{R_T} + \frac{1}{R_S} \qquad \text{Equation (1)}$$

At the resonant frequency of the tank circuit, I, $V_O$, and $R_P$ are related simply by Ohm's law: $V_O = IR_P$. Thus, as the sample loading resistance changes, the drive current necessary to maintain $V_0$ changes. Thus, the drive current I is a measure of the loading resistance $R_S$ and related local thickness of the conductive layer.

The marginal oscillator of FIG. 3B provides a number of advantages over other marginal oscillator designs. First, may be operated at frequencies ranging from DC to the cutoff frequencies of the transistors. Second, it is compatible with high voltage levels (e.g., it may be used with voltages on the order of volts rather than millivolts). Finally, it is both simple and stable.

Figure 4:
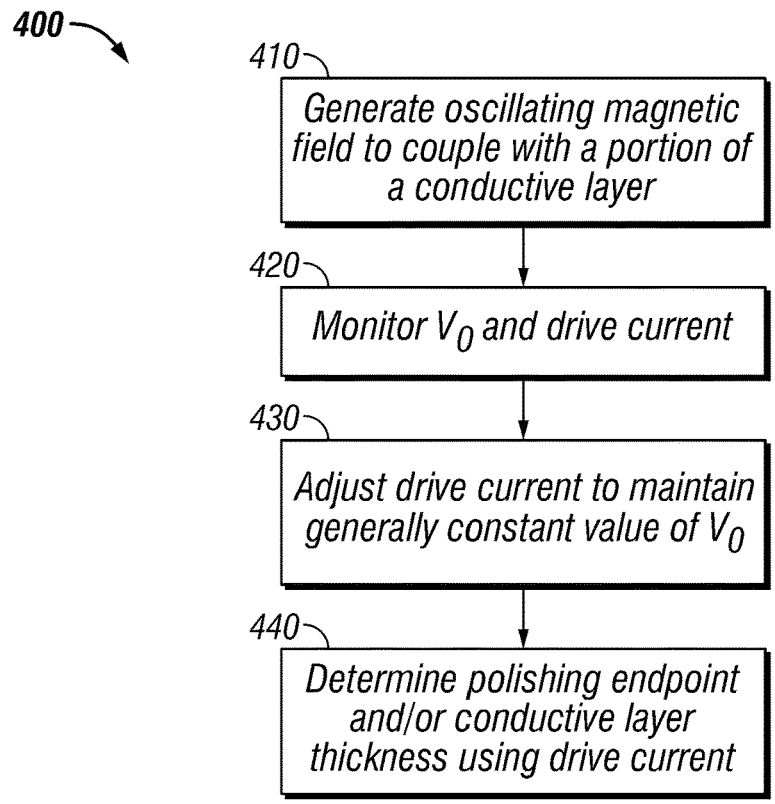
FIG. 4 shows a method that may be used to determine a polishing endpoint or conductive layer thickness, according to an embodiment.

System 300 may be used to monitor a thickness of a conductive layer on a wafer according to a process such as a process 400 of FIG. 4. Process 400 may be performed, for example, while a wafer with a conductive layer is being polished, and while a core is being translated relative to the wafer. An oscillating magnetic field may be generated using a marginal oscillator circuit, where the oscillating magnetic field is to couple with a portion of a conductive layer on the wafer (410). For an eddy current sensing system positioned proximate to a polishing pad, the oscillating magnetic field extends through the pad and into the portion of the conductive layer.

A voltage $V_O$ is monitored, where $V_O$ is the magnitude of a time-dependent potential difference across a coil and capacitor of an eddy current sensing system. A drive current for the marginal oscillator is also monitored (420). The drive current is adjusted to maintain constant $V_O$ (430). Since the drive current necessary to maintain a constant amplitude is linearly related to the thickness of the conductive layer, the drive current may then be used to determine a polishing endpoint and/or a local thickness of the conductive layer (440). Note that the acts in method 400 may be performed continuously and concurrently, although they are listed separately herein.

The eddy current sensing system described above and shown in FIGS. 3A and 3B may provide enhanced signal to noise ratio, enhanced linearity, and enhanced stability. Additional benefits may be obtained by providing an eddy current sensing system with improved spatial resolution. Improved spatial resolution may be particularly beneficial for RTPC. Obtaining high resolution wafer profile information allows for more accurate adjustment of processing parameters, and thus may enable fabrication of devices with smaller CDs. Systems and techniques described herein provide coil geometries that may be used in a high resolution eddy current system.

Figure 5:
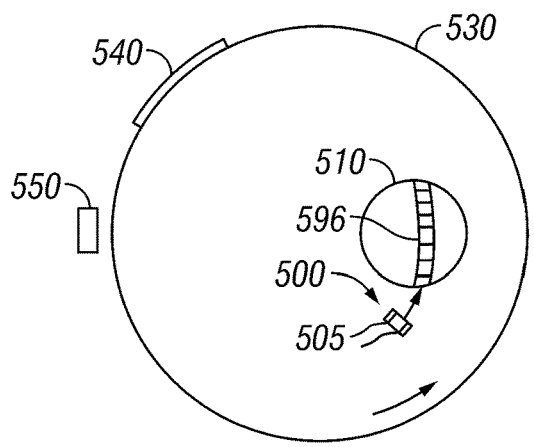
FIG. 5 is a top view of an embodiment of a chemical mechanical polishing apparatus including an eddy current monitoring system.

One way to increase spatial resolution is to reduce the size of the core/coil system so that the magnetic field couples to a smaller area of the wafer. FIG. 5 show a top view of an eddy current sensing system 500 including a core 505 as it sweeps beneath a substrate 510 as a platen 530 is rotated. A computer (not shown) may subdivide the sensed eddy current signal (raw or processed) into a plurality of sampling zones 596. As FIG. 5 illustrates, the spatial resolution of the system is limited by the distance between the protrusions of coil 505 (note that other parameters such as the distance between the core and the conductive region and the shape of the core may also affect the spatial resolution of the system). Platen 530 may include a flag 540 to be sensed by a flag sensor 550 to determine a rotational position of platen 530.

Although the spatial resolution may be improved by decreasing the size of the core/coil system, it may be difficult to decrease the size of the core/coil system without suffering unacceptable detriment to the measurement quality. A number of design considerations may place limits on the minimum core size. For example, desired values of frequency, dynamic impedance, and quality factor may place limits on the minimum core size.

The range of desired frequencies for eddy current sensing may be chosen based on a response time considerations (higher frequencies enable faster response), and on skin depth considerations. As the frequency of the electromagnetic radiation (i.e., the frequency of the magnetic field) increases, the skin depth (a measure of the distance that the magnetic field penetrates) decreases. In order to accurately measure the thickness of a layer, the magnetic field should penetrate the entire thickness.

Limitations on both the quality factor and the dynamic impedance prevent the need to switch inconveniently large currents in the electronic loop.

Table 1 shows some desired values for frequency, dynamic impedance, and quality factor that may limit the minimum core size. The frequency value in Table 1 is based on a copper film up to about 1.5 microns thick; for other materials and/or thicknesses, different frequency values may be appropriate. Note that L represents the inductance of a coil such as coil 370 of FIG. 3B, C represents a capacitance of a capacitor such as capacitor 380 of FIG. 3B, Z represents the unloaded dynamic impedance of a coil and capacitor system, and $R_P$ represents a parallel loss resistance, which includes both the parallel loss resistance of the LC circuit and of the conductive layer.

TABLE 1

| Parameter | Value | Design Guideline |
|---|---|---|
| Frequency | $\frac{1}{2\pi\sqrt{LC}}$ | ≤350 kHz |
| Dynamic Impedance | $\sqrt{\frac{L}{C}}$ | ≥100 ohms |
| Quality Factor | $\frac{R_P}{Z}$ | ≥10 |

Design guidelines such as those listed in Table 1 may be difficult (or impossible) to achieve for small cores. For example, as the size of the core is decreased, finer wires with increased series loss resistance are generally required. Thus, the Q-factor of the system decreases as the size of the core is decreased.

The current inventors recognized that one can trade off spatial resolution in perpendicular directions by using a core that is long in one direction and narrow in another. FIGS. 6A and 6B show side and top views of a coil/core system 600 that may be used to provide high resolution eddy current measurements without a significant detriment to the Q-factor of the system. An elongated core 610 is generally "E" shaped; that is, it has three protrusions extending upward from a back portion. As shown in FIG. 6B, core 610 extends a length L that is greater than the width W of core 610. A coil 620 may be wound around the center protrusion. Coil 620 may be coupled with a capacitor 630. In implementations of eddy current sensing systems such as system 200 of FIGS. 2A and 2B, separate sense and drive coils may be used.

In some implementations, a coil such as coil 620 may be litz wire (woven wire constructed of individual film insulated wires bunched or braided together in a uniform pattern of twists and length of lay), which may be less lossy than solid wire for the frequencies commonly used in eddy current sensing. Core 610 may be a MnZn ferrite, or may be a NiZn ferrite. Core 610 may be coated. For example, core 610 may be coated with a material such as parylene to prevent water from entering pores in core 610, and to prevent coil shorting.

FIGS. 7A and 7B show side and top views of a different coil/core system 700 that may alternately be used to provide high resolution eddy current measurements without a significant detriment to the sensed signal. An elongated core 710 can be "U" shaped; that is, it has two protrusions extending upwards from the ends of a back portion. As shown in FIG. 7B, core 710 extends a length L that is larger than the width W of core 710. A coil 720 may be wound around the two protrusions and may be coupled with a capacitor 730. Again, for implementations such as those shown in FIGS. 2A and 2B, separate drive and sense coils may be used. FIG. 7C shows a side view of an alternate winding scheme for a U-shaped core. As shown in FIG. 7C, coil 720 may be wound between the two protrusions in a "FIG. 8" configuration.

In some implementations, the core may be shielded to more precisely direct the flux lines toward a particular portion of a conductive layer and thus to improve spatial resolution. Note that shielding the core may result in a reduction of the Q-factor, and thus the shielding configuration shown should provide sufficient direction of flux lines without too much detriment to the Q-factor. FIGS. 8A through 8C show different shielding configurations that may be used. FIG. 8A shows a side view of a shield 810 proximate to a core 800. Shield 810 may have a gap (not shown) so that eddy currents are not induced in shield 810 due to the time-dependent magnetic field generated by the eddy current sensing system. Shield 810 may be made of sheet aluminum. FIG. 8B shows top and side views of a shield 820, which may also be made of sheet aluminum. The top view shows a gap 825 to prevent eddy current generation in shield 820. FIG. 8C shows a top view of a shield 830 formed using copper tape. A gap 835 between a first end 836 and a second end 837 of the copper tape prevents generation of eddy currents in shield 830.

Figure 9A:
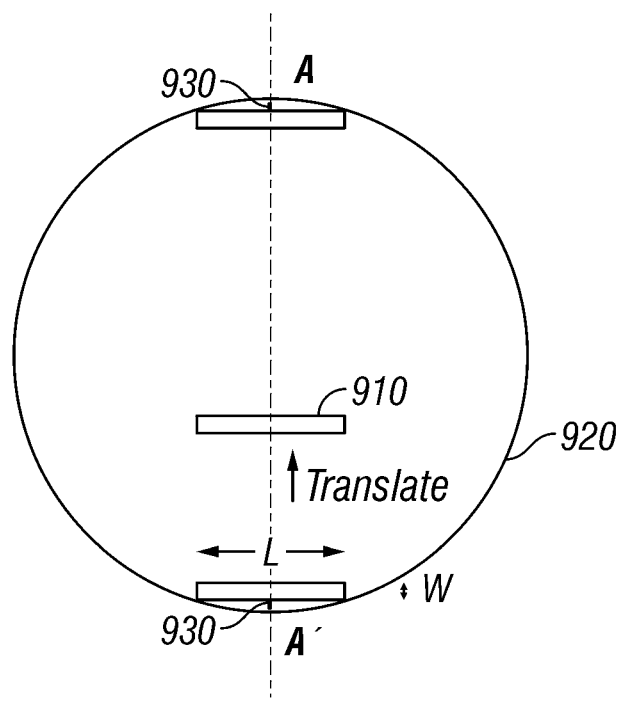
FIGS. 9A and 9B show top and side views of a chemical mechanical polishing apparatus using an elongated core, according to an embodiment.
Figure 9B:
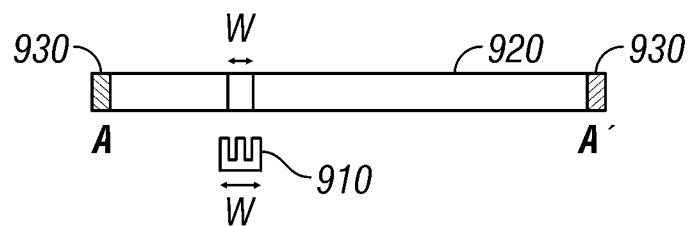

FIGS. 9A and 9B show top and side views of the relative position of a substrate 920 with respect to an elongated core 910 (which may be similar to core 610 of FIGS. 6A and 6B or core 710 of FIGS. 7A and 7B). For a scan through a slice A-A' through the center of a wafer 920 having a radius R, core 910 is oriented so that its long axis is perpendicular to a radius of wafer 920. Core 910 is translated relative to the diameter of the wafer as shown. Note that the magnetic field produced by a coil wound around core 910 induces eddy currents in a conductive region that is elongated in shape as well, with a length greater than a width. However, the length and the width are generally not the same as the length and width of core 910, and the aspect ratio and cross section of the conductive region is generally different than that of core 910 as well.

Although the configuration of FIGS. 9A and 9B may provide improved resolution for most of slide A-A' of wafer 920, as core 910 translates along the first and last segments 930 of the radius, a portion of core 910 is not proximate to the substrate. Therefore the measurement for segments 930 is less accurate and may place a limit on the maximum desirable length L of core 910. Additionally, as core 910 approaches the center of wafer 920, it is sampling a larger radial range. Therefore, the spatial resolution for a particular radial distance r≈R is significantly better than the spatial resolution of r≈0.

As explained above, the length L of core 910 is greater than its width W. That is, the aspect ration L/W is greater than one. Different values for L, W, and L/W may be used for different implementations. For example, W may range from a fraction of a millimeter to more than a centimeter, while L may range from about a millimeter (for smaller values of W) to ten centimeters or greater.

In a particular implementation, W is between about a millimeter and about ten millimeters, while L is between about one centimeter to about five centimeters. More particularly, a coil such as coil 610 of FIGS. 6A and 6B may be about five millimeters wide, with each protrusion being about a millimeter in width and with each space between adjacent protrusions being about a millimeter. The length may be about twenty millimeters. The height may be about five millimeters and may be increased if desired to allow for more coil turns. For a coil such as coil 710 of FIGS. 7A and 7B, the length may be about two centimeters and the width may be about 2.5 millimeters. Each protrusion may be about one millimeter in width, and the space between the protrusions may be about 1.5 millimeters. The height may be about three millimeters. Of course, the values given here are exemplary; many other configurations are possible.

Figure 10A:
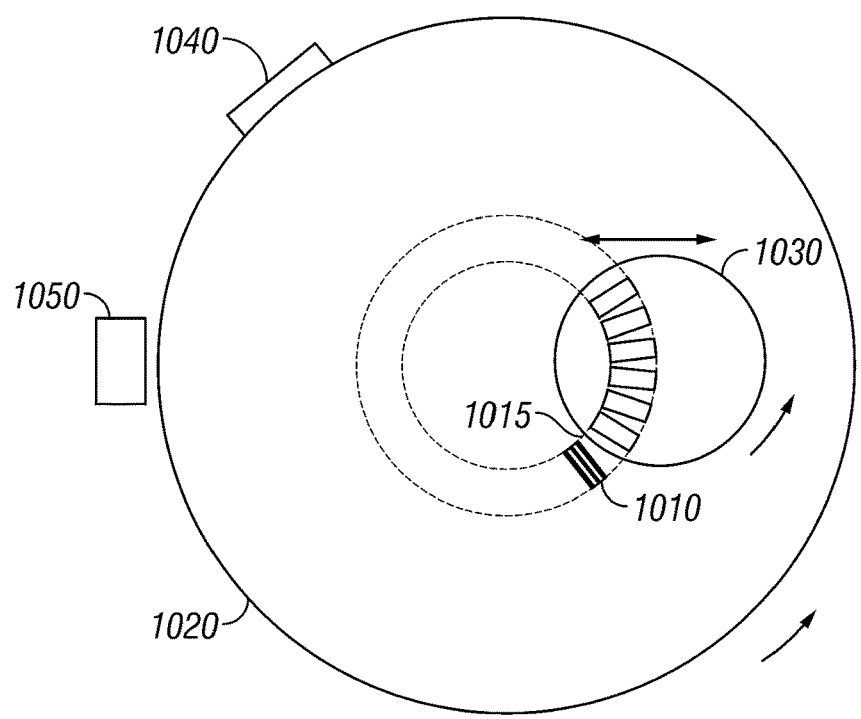
FIGS. 10A and 10B show top views of a chemical mechanical polishing apparatus using an elongated core, according to an embodiment.

In some implementations, the long axis of an elongated core may not be exactly perpendicular to a radius of a substrate. However, an elongated core may still provide improved resolution over available core geometries, particularly near the wafer edge. FIG. 10A shows an implementation in which an elongated core 1010 is positioned underneath a platen 1020. Prior to sweeping underneath a substrate 1030, core 1010 is at position 1015. At position 1015, core 1010 is positioned approximately perpendicular to a radius of substrate 1030. Therefore, for r≈R, the portion of a conductive layer that couples with the magnetic field produced by the coil wound around core 1010 is generally at the same radial distance from the center of the wafer. Note that both platen 1020 and substrate 1030 are both rotating as core 1010 sweeps beneath substrate 1030, and that the wafer may also sweep with respect to platen 1020, as indicated. Additionally, a flag 1040 and a flag sensor 1050 may be used to sense the rotational position of platen 1020.

Figure 10B:
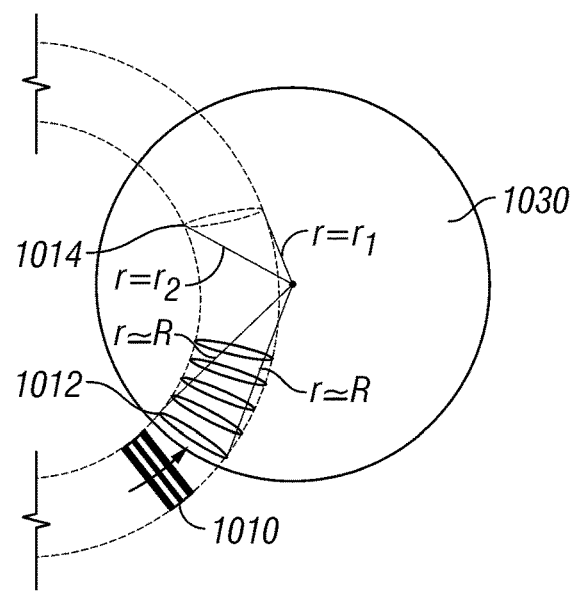

FIG. 10B shows a close up of wafer 1030 as core 1010 sweeps below wafer 1030. At a first position 1012, core 1010 measures the thickness at a radius r≈R. However, at a position 1014, core spans a range of radii from $r_1$ to $r_2$. Therefore, the spatial resolution at the outer edge of wafer 1030 is much better than the spatial resolution near the center of wafer 1030. Note that this effect is reduced as the length L of core 1010 is decreased.

Figure 11:
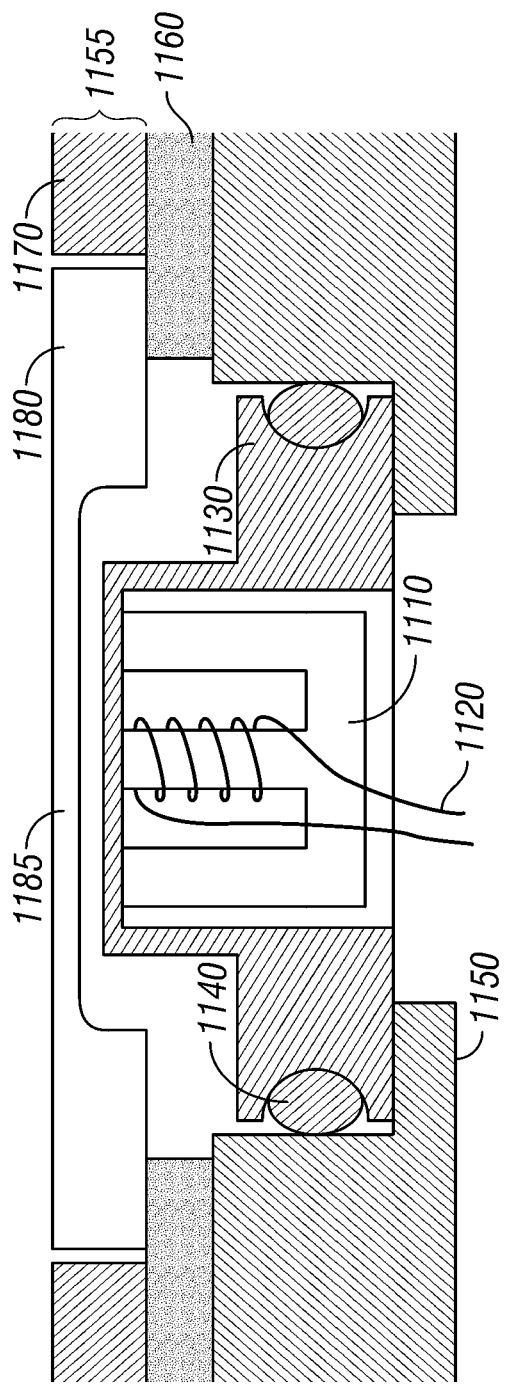
FIG. 11 shows a side view of a core positioned proximate to a polishing pad, according to an embodiment.

As noted above, spatial resolution also depends on the distance between the core and the conductive layer. FIG. 11 shows a side view of a system 1100 providing close proximity between a core, as well as preventing fluid from leaking. A core 1110 is coupled with a coil 1120 for producing a time-dependent magnetic field to induce eddy currents in a conductive region on a wafer (not shown). Core 1110 and coil 1120 are fixed within a sensor housing 1130. Sensor housing 1130 both protects core 1110 and coil 1120 from fluid and positions it with respect to the wafer. Housing 1130 is coupled with an upper platen 1150 via an o-ring seal 1140 to prevent leaking. A pad assembly 1155 includes a sub-pad 1160, a pad 1170, and a pad window 1180, which includes a thinned portion 1185. Thinned portion 1185 allows core 1110 to be positioned in close proximity to the wafer. For example, the distance between the top of core 1110 may be about 50 mils. Note that other configurations may be used; particularly, pad configurations without a sub-pad and/or without a pad window may be used.

Figure 12:
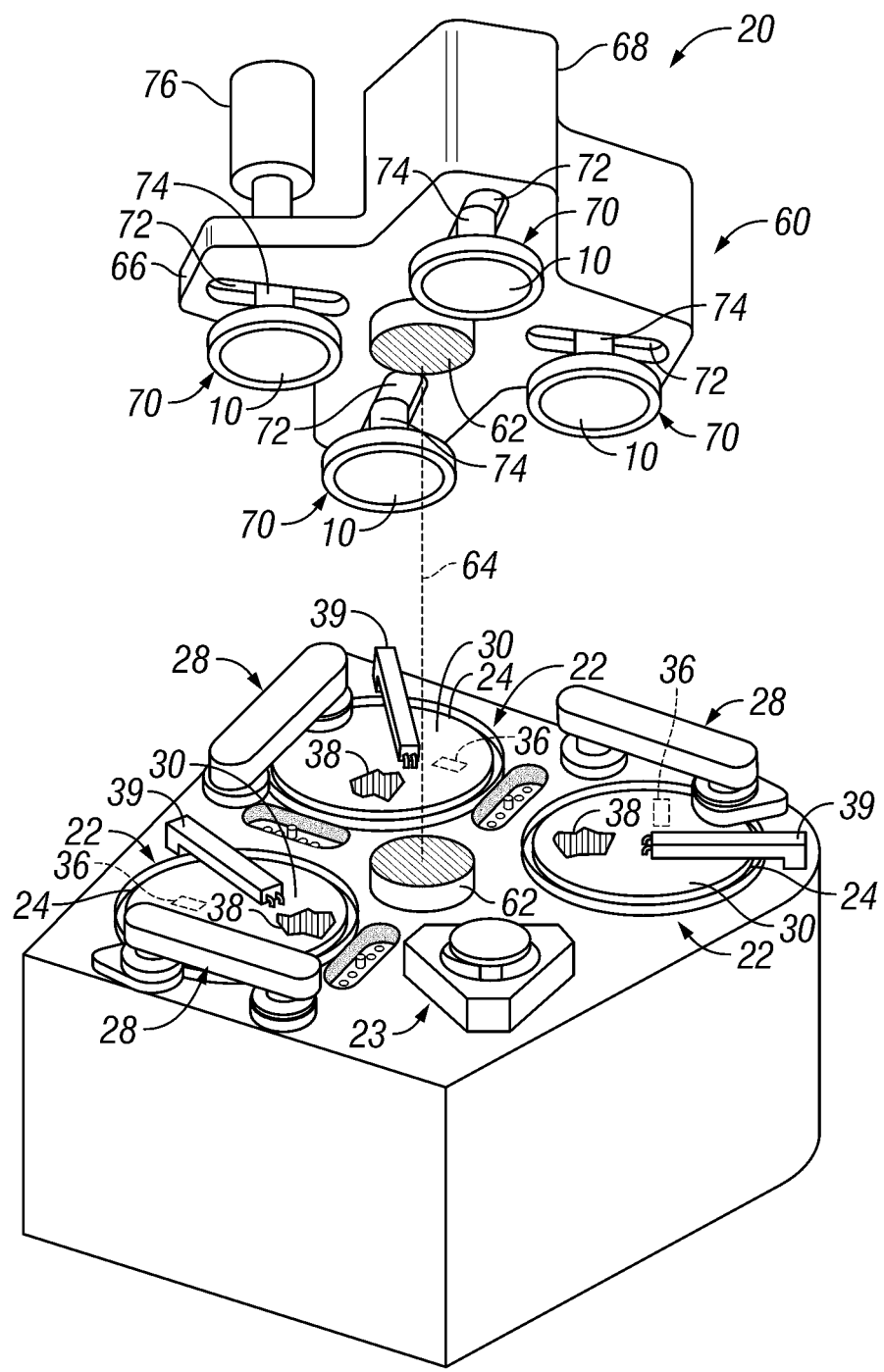
FIG. 12 is a schematic exploded perspective view of an embodiment of a chemical mechanical polishing apparatus.
Figure 13:
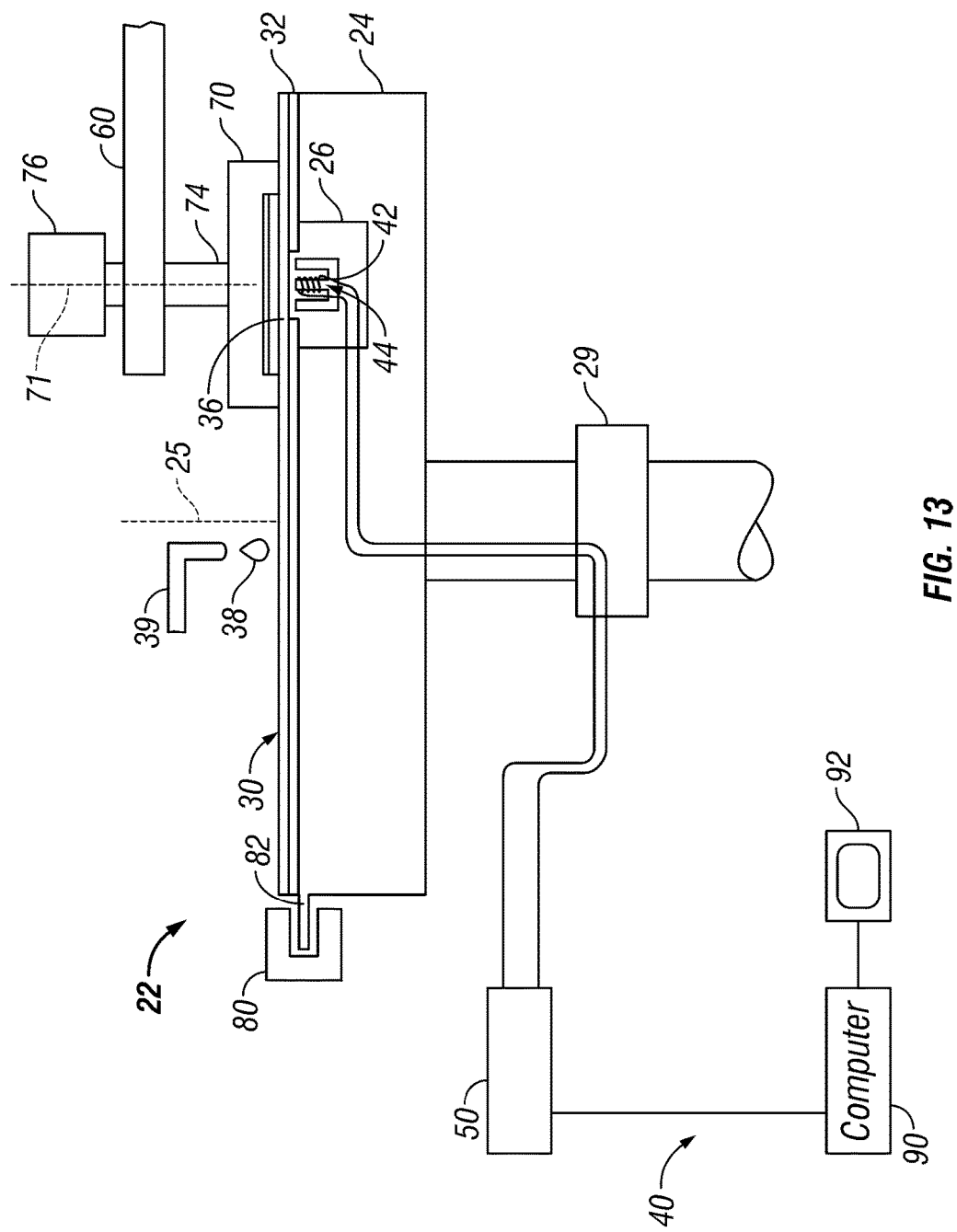
FIG. 13 is a side view illustrating the positioning of a core with respect to a platen, according to an embodiment.

FIG. 12 shows a chemical mechanical polishing apparatus 20 that may be used with an eddy current sensing system such as those described above. A description of a similar polishing apparatus 20 can be found in U.S. patent application Ser. No. 09/900,664, the entire disclosure of which is incorporated herein by reference. FIG. 13 shows how a core 42 (e.g., a core such as core 610 of FIGS. 6A and 6B, core 710 of FIGS. 7A and 7B, or other core) may be positioned with respect to a polishing pad 30 having a thinned section 36 (and thus positioned with respect to polishing station 22 of apparatus 20).

Referring to FIGS. 12 and 13, one or more substrates 10 can be polished by CMP apparatus 20. Polishing apparatus 20 includes a series of polishing stations 22 and a transfer station 23. Transfer station 23 transfers the substrates between the carrier heads and a loading apparatus.

Each polishing station includes a rotatable platen 24 on which is placed a polishing pad 30. The first and second stations can include a two-layer polishing pad with a hard durable outer surface or a fixed-abrasive pad with embedded abrasive particles. The final polishing station can include a relatively soft pad. Each polishing station can also include a pad conditioner apparatus 28 to maintain the condition of the polishing pad so that it will effectively polish substrates.

A rotatable multi-head carousel 60 supports four carrier heads 70. The carousel is rotated by a central post 62 about a carousel axis 64 by a carousel motor assembly (not shown) to orbit the carrier head systems and the substrates attached thereto between polishing stations 22 and transfer station 23. Three of the carrier head systems receive and hold substrates, and polish them by pressing them against the polishing pads. Meanwhile, one of the carrier head systems receives a substrate from and delivers a substrate to transfer station 23.

Each carrier head 70 is connected by a carrier drive shaft 74 to a carrier head rotation motor 76 (shown by the removal of one quarter of cover 68) so that each carrier head can independently rotate about it own axis. In addition, each carrier head 70 independently laterally oscillates in a radial slot 72 formed in carousel support plate 66. A description of a suitable carrier head 70 can be found in U.S. Pat. No. 6,422,927, the entire disclosure of which is incorporated by reference. In operation, the platen is rotated about its central axis 25, and the carrier head is rotated about its central axis 71 and translated laterally across the surface of the polishing pad.

A slurry 38 containing a reactive agent (e.g., deionized water for oxide polishing) and a chemically-reactive catalyzer (e.g., potassium hydroxide for oxide polishing) can be supplied to the surface of polishing pad 30 by a slurry supply port or combined slurry/rinse arm 39. If polishing pad 30 is a standard pad, slurry 38 can also include abrasive particles (e.g., silicon dioxide for oxide polishing). A recess 26 is formed in platen 24, and a thin section 36 can be formed in polishing pad 30 overlying recess 26. Aperture 26 and thin pad section 36, if needed, are positioned such that they pass beneath substrate 10 during a portion of the platen's rotation, regardless of the translational position of the carrier head.

As shown in FIG. 13, CMP apparatus 20 can also include a position sensor 80, such as an optical interrupter, to sense when core 42 is beneath substrate 10. For example, the optical interrupter could be mounted at a fixed point opposite carrier head 70. A flag 82 may be attached to the periphery of the platen. The point of attachment and length of flag 82 is selected so that it interrupts the optical signal of sensor 80 while core 42 sweeps beneath substrate 10. Alternately, the CMP apparatus can include an encoder to determine the angular position of the platen.

Referring to FIG. 13, an eddy current monitoring system 40 may include drive and feedback circuitry 50, including an oscillator such as a marginal oscillator described above and shown in FIGS. 3A and 3B. The core 42 and the coil 44 of the eddy current sensing system located below thin section 36 of polishing pad 32 sweep beneath the substrate with each rotation of the platen. Note that although a single coil 44 is shown here, in some implementations separate drive and sense coils are used, and separate sensing circuitry is provided. Circuitry 50 maybe located apart from platen 24, and can be coupled to the components in the platen through a rotary electrical union 29.

A computer 90 can receive measurements from circuitry 50, and can be programmed to divide the measurements from each sweep of the core beneath the substrate into a plurality of sampling zones (e.g., sampling zones 596 of FIG. 5), to calculate the radial position of each sampling zone, to sort the measurements into radial ranges, to determine minimum, maximum and average measurements for each sampling zone, and to use multiple radial ranges to determine the polishing endpoint, as discussed in U.S. Pat. No. 6,399,501, filed Dec. 13, 1999, issued Jun. 4, 2002, the entirety of which is incorporated herein by reference. Note that the measurements may be amplitude measurements, phase measurements, and/or drive current measurements, depending on the configuration of system 40. Output from computer may be displayed on an output device 92 during polishing to permit a user to visually monitor the progress of the polishing operation.

Moreover, after sorting the eddy current measurements into radial ranges, information on the metal film thickness can be fed in real-time into a closed-loop controller to periodically or continuously modify the polishing pressure profile applied by a carrier head, as discussed in U.S. Patent Application Ser. No. 60/143,219, filed Jul. 7, 1999, the entirety of which is incorporated herein by reference. For example, the computer could determine that the endpoint criteria have been satisfied for the outer radial ranges but not for the inner radial ranges. This would indicate that the underlying layer has been exposed in an annular outer area but not in an inner area of the substrate. In this case, the computer could reduce the diameter of the area in which pressure is applied so that pressure is applied only to the inner area of the substrate, thereby reducing dishing and erosion on the outer area of the substrate. Alternatively, the computer can halt polishing of the substrate on the first indication that the underlying layer has been exposed anywhere on the substrate, i.e., at first clearing of the metal layer.

A number of implementations have been described. Nevertheless, it will be understood that various modifications may be made without departing from the spirit and scope of the invention. For example, different coil geometries may be used. The core may be positioned differently with respect to the platen and substrate than described. Although elongated cores with generally rectangular cross section are shown, other configurations may be used. For example, ovoid cross sections may be used, where the "length" then refers to the long axis and the "width" refers to the short axis. The acts in the processes shown in FIGS. 1 and 4 need not necessarily be performed in the order shown. Accordingly, other embodiments are within the scope of the following claims.

What is claimed is:

1. An apparatus for semiconductor processing, comprising:
    a carrier to hold a surface of a substrate in contact with a polishing surface; and
    an eddy current monitoring system to monitor the substrate during polishing, the eddy current monitoring system including
        a core that is movable relative to the carrier,
        a coil wound around the core,
        a drive system to generate a current in the coil so as to create a magnetic field that passes through the core, and
        a sensing system to generate a signal based on eddy currents generated in a conductive portion of the substrate by the magnetic field,
    wherein the core extends between and includes two physical ends that provide two opposite magnetic poles of the core when the drive system creates the magnetic field, wherein at least one of the two ends of the core is provided by a portion of the core that has an external, continuous top surface positioned to be parallel to the polishing surface during polishing and has external side walls that laterally surround the portion, wherein the external continuous top surface has an outer perimeter defined by edges where the side walls intersect the external, continuous top surface, and wherein the side walls extend from the edges of the external, continuous top surface away from the carrier, wherein the eddy current monitoring system is configured such that when the drive system creates the magnetic field, the magnetic field passes through the external, continuous top surface, wherein the external, continuous top surface of the portion has a length and a width both parallel to the polishing surface and being edge-to-opposite-edge of the outer perimeter across the external, continuous top surface with the length perpendicular to the width, wherein the length is longer than the width, and wherein the core is oriented such that the length is substantially perpendicular to a direction in which the core is moving relative to the substrate.

2. The apparatus of claim 1, wherein the core comprises a back portion and the portion with the external, continuous top surface proximal to the polishing surface is a protrusion extending perpendicularly from the back portion.

3. The apparatus of claim 1, wherein the length is at least twice the width.

4. The apparatus of claim 1, further comprising a rotatable platen to support the polishing surface, and the core is mounted on the platen.

5. The apparatus of claim 1, wherein the core is oriented such that the length is substantially perpendicular to a radius of the substrate when the core is at an outer edge of the substrate.

6. An apparatus for semiconductor processing, comprising:
   a carrier to hold a surface of a substrate in contact with a polishing surface; and
   an eddy current monitoring system to monitor the substrate during polishing, the eddy current monitoring system including
      a core that is movable relative to the carrier,
      a coil wound around a portion of the core,
      a drive system to generate a current in the coil so as to create a magnetic field that passes through the core, and
      a sensing system to generate a signal based on eddy currents generated in a conductive portion of the substrate by the magnetic field,
   wherein the core comprises a back portion and a plurality of protrusions extending perpendicularly from the back portion, the plurality of protrusions providing two opposite magnetic poles of the core when the drive system creates the magnetic field,
   wherein each respective protrusion of the plurality of protrusions has an external, continuous top surface positioned to be parallel to the polishing surface during polishing and has external side walls that laterally surround the respective protrusion, and wherein the external, continuous top surface of each respective protrusion has an outer perimeter defined by edges where the side walls of each respective protrusion intersect the external, continuous top surface of the respective protrusion, and wherein the side walls of each respective protrusion extend from the edges of the external, continuous top surface of the respective protrusion away from the carrier,
   wherein the eddy current monitoring system is configured such that when the drive system creates the magnetic field, the magnetic field passes through the external, continuous top surface of each respective protrusion,
   wherein the external, continuous top surface of each respective protrusion has a length and a width with both the length and the width being parallel to the polishing surface and being edge-to-opposite-edge of the outer perimeter of the respective protrusion,
   wherein for each respective protrusion the length is perpendicular to and longer than to the width, and
   wherein the core is oriented such that the length of each respective protrusion is substantially perpendicular to a direction in which the core is moving relative to the substrate.

7. The apparatus of claim 6, wherein the core has a U-shaped cross section and the plurality of protrusions comprises two protrusions.

8. The apparatus of claim 6, wherein the core has a E-shaped cross section and the plurality of protrusions comprises three protrusions.

9. The apparatus of claim 6, wherein the coil is coupled with the plurality of protrusions in a figure eight configuration.

10. A method of in-situ profile control comprising:
   polishing a conductive layer on a substrate with a polishing surface;
   inducing eddy currents in a first region of the conductive layer on the substrate with an eddy current monitoring system by driving a coil wound around a core so as to generate a magnetic field that passes through the core;
   moving the core of the eddy current monitoring system relative to the substrate,
      wherein the core extends between and includes two physical ends that provide two opposite magnetic poles of the core when the drive system creates the magnetic field, wherein at least one of the two ends of the core is provided by a portion of the core that has an external, continuous top surface positioned to be parallel to the polishing surface during polishing and has external side walls that laterally surround the portion, wherein the external continuous top surface has an outer perimeter defined by edges where the side walls intersect the external, continuous top surface, and wherein the side walls extend from the edges of the external, continuous top surface away from the polishing surface,
      wherein the magnetic field passes through the external, continuous top surface,
      wherein the external, continuous top surface of the portion has a length and a width both parallel to the polishing surface and being edge-to-opposite-edge of the outer perimeter across the external, continuous top surface with the length perpendicular to the width, wherein the length is longer than the width, and
      wherein the core is oriented such that the length is substantially perpendicular to a direction in which the core is moving relative to the substrate; and
   acquiring measured thickness data for the conductive layer in the first region, the thickness data based on the eddy currents induced in the first region.

11. The method of claim 10, wherein the core comprises a back portion and the portion with the external, continuous top surface proximal to the polishing surface is a protrusion extending perpendicularly from the back portion.

12. The method of claim 10, wherein the length is at least twice the width.

13. The method of claim 10, wherein the moving the core comprises rotating platen that supports the polishing surface and the core.

14. The method of claim 10, wherein the core is oriented such that the length is substantially perpendicular to a radius of the substrate when the core is at an outer edge of the substrate.

15. A method of in-situ profile control comprising:
- polishing a conductive layer on a substrate with a polishing surface;
- inducing eddy currents in a first region of the conductive layer on the substrate with an eddy current monitoring system by driving a coil wound around a portion of a core so as to generate a magnetic field that passes through the core;
- moving the core of the eddy current monitoring system relative to the substrate,
    - wherein the core comprises a back portion and a plurality of protrusions extending perpendicularly from the back portion, and wherein inducing eddy currents includes directing the magnetic field through the plurality of protrusions with the plurality of protrusions providing two magnetic opposite poles of the core when the drive system creates the magnetic field,
    - wherein each respective protrusion of the plurality of protrusions has an external, continuous top surface positioned to be parallel to the polishing surface during polishing and has external side walls that laterally surround the respective protrusion, and wherein the external, continuous top surface of each respective protrusion has an outer perimeter defined by edges where the side walls of the respective protrusion intersect the external, continuous top surface of the respective protrusion, and wherein the side walls of each respective protrusion extend from the edges of the external, continuous top surface of the respective protrusion away from the polishing surface,
    - wherein the magnetic field passes through the external, continuous top surface;
    - wherein the external, continuous top surface of each respective protrusion has a length and a width with both the length and the width being parallel to the polishing surface and being edge-to-opposite-edge of the outer perimeter of the respective protrusion,
    - wherein for each respective protrusion the length is perpendicular to and longer than the width, and
    - wherein the core is oriented such that the length of the external, continuous top surface of each respective protrusion is substantially perpendicular to a direction in which the core is moving relative to the substrate; and
- acquiring measured thickness data for the conductive layer in the first region, the thickness data based on the eddy currents induced in the first region.

16. The method of claim 15, wherein the core has a U-shaped cross section and the inducing eddy currents includes directing the magnetic field through two of the plurality of protrusions.

17. The method of claim 15, wherein the core has a E-shaped cross section and the inducing eddy currents includes directing the magnetic field through three of the plurality of protrusions.

* * * * *

UNITED STATES PATENT AND TRADEMARK OFFICE
CERTIFICATE OF CORRECTION

PATENT NO. : 10,105,811 B2
APPLICATION NO. : 13/207213
DATED : October 23, 2018
INVENTOR(S) : G. Laurie Miller et al.

Page 1 of 1

It is certified that error appears in the above-identified patent and that said Letters Patent is hereby corrected as shown below:

In the Claims

Column 16, Line 29, in Claim 16, after "two" insert -- protrusions --.

Column 16, Line 33, in Claim 17, after "three" insert -- protrusions --.

Signed and Sealed this
Twenty-second Day of January, 2019

Andrei Iancu
*Director of the United States Patent and Trademark Office*